United States Patent
Boerstler et al.

(10) Patent No.: US 7,737,794 B2
(45) Date of Patent: Jun. 15, 2010

(54) PHASE LOCKED LOOP WITH TEMPERATURE AND PROCESS COMPENSATION

(75) Inventors: David W. Boerstler, Round Rock, TX (US); Masaaki Kaneko, Round Rock, TX (US); Toshiyuki Ogata, Tokyo (JP); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/120,331

(22) Filed: May 14, 2008

(65) Prior Publication Data

US 2009/0285344 A1 Nov. 19, 2009

(51) Int. Cl.
G01R 23/02 (2006.01)

(52) U.S. Cl. .............................. 331/44; 331/17; 331/176

(58) Field of Classification Search ............ 331/17, 331/44, 176
See application file for complete search history.

(56) References Cited

U.S. PATENT DOCUMENTS

| | | | |
|---|---|---|---|
| 6,683,502 B1 | 1/2004 | Groen et al. | |
| 7,174,144 B2 * | 2/2007 | Lin | 455/258 |
| 7,356,716 B2 * | 4/2008 | Boerstler et al. | 713/300 |
| 7,589,575 B2 * | 9/2009 | Boerstler et al. | 327/156 |
| 2006/0119420 A1 | 6/2006 | Li et al. | |
| 2006/0139105 A1 | 6/2006 | Maxim et al. | |
| 2008/0018408 A1 | 1/2008 | Boerstler et al. | |

FOREIGN PATENT DOCUMENTS

WO  WO 2005/101664 A1  10/2005

* cited by examiner

*Primary Examiner*—Robert Pascal
*Assistant Examiner*—James E Goodley
(74) *Attorney, Agent, or Firm*—Stephen J. Walder, Jr.; Matthew B. Talpis

(57) ABSTRACT

Mechanisms are provided for compensating for process and temperature variations in a circuit. The mechanisms may select at least one resistor in a plurality of resistors in the circuit to provide a resistance value for generating a calibration voltage input to the circuit to compensate for variations in process. A reference signal may be compared to a feedback signal generated by the circuit based on the calibration signal. A determination is made as to whether the feedback signal is within a tolerance of the reference signal and, if so, an identifier of the selected at least one resistor is stored in a memory device coupled to the circuit. The circuit may be operated using the selected at least one resistor based on the identifier stored in the memory device. An apparatus and integrated circuit device utilizing these mechanisms are also provided.

11 Claims, 7 Drawing Sheets

PHASE LOCKED LOOP WITH TEMPERATURE AND PROCESS COMPENSATION

BACKGROUND OF THE INVENTION

1. Field of the Invention

The present application relates generally to an improved phase locked loop circuit. More specifically, the present application is directed to a phase locked loop (PLL) that has temperature and process compensation elements.

2. Background of the Invention

A phase locked loop (PLL) is a closed loop feedback control system that generates an output signal in relation to the frequency and phase of an input, or reference, signal. The PLL automatically responds to the frequency and phase of the input signal by raising or lowering the frequency of a controlled oscillator until it is matched to the reference in both frequency and phase.

PLLs are widely used in computing devices, telecommunications systems, radio systems, and other electronic applications where it is desired to stabilize a generated signal or to detect signals in the presence of noise. Since an integrated circuit can hold a complete PLL, the use of PLLs in modern electronic devices is widespread.

PLLs generally include a phase detector circuit, a low pass filter circuit, and a voltage controlled oscillator (VCO) placed in a negative feedback configuration. In addition to these elements, a frequency divider circuit may be provided in the feedback path, the reference signal path, or both, in order to make the PLL's output signal an integer multiple of the reference signal. The phase detector compares the phase of two inputs and outputs a corrective signal to control the VCO such that the phase difference between the two inputs becomes zero. The two inputs are a reference signal and the divided output of the VCO.

Various types of phase detector circuits are known including simple XOR gates, four-quadrant multiplier (or "mixer") circuits, proportional phase detector circuits, and the like. A more complex phase detector uses a simple state machine to determine which of the two signals has a zero-crossing earlier or more often. This brings the PLL into lock even when it is off frequency. This type of phase detector circuit is known as a phase frequency detector (PFD).

The VCO is used to generate a periodic output signal. For example, if the VCO is at approximately the same frequency as the reference signal, if the phase of the VCO falls behind the phase of the reference signal, the phase detector circuit causes a charge pump of the PLL to charge the control voltage so that the VCO speeds up. Likewise, if the phase of the VCO progresses ahead of the phase of the reference signal, the phase detector circuit causes the charge pump to change the control voltage to slow down the VCO. The low-pass filter smooths out the abrupt control inputs from the charge pump. Since the frequency of the VCO may be far from the frequency of the reference signal, practical phase detectors may also respond to frequency differences, such as by using a phase frequency detector (PFD), so as to increase the lock-in range of allowable inputs.

As discussed above, most PLLs also include a frequency divider circuit between the VCO and the feedback input to the phase detector circuit in order to produce a frequency synthesizer. This frequency divider circuit may be programmable so as to achieve different output or feedback frequencies of the output signal. Some PLLs may also include a frequency divider circuit between the reference clock input and the reference input to the phase detector circuit. If this frequency divider circuit divides the frequency of the reference signal by M, the inclusion of this frequency divider circuit between the reference clock input and the reference input to the phase detector circuit allows the VCO to multiply the reference signal's frequency by N/M, where N is the multiplier provided by the VCO.

PLLs are used in a number of different ways in modern electronic systems. One use of PLLs is to provide clock signals for processors and other electronic devices. Typically, the clock signals supplied to these processors and other electronic devices come from clock generator PLLs which multiply a lower-frequency reference clock signal up to an operating frequency required by the processor or electronic device. Clock distribution logic may then distribute the clock signal generated by the PLL to various endpoints in the processor or electronic device.

Another use of PLLs is to provide a spread spectrum functionality to reduce interference with other electronic devices by spreading the energy of an input signal over a larger portion of the frequency spectrum of the PLL output. All electronic devices or systems emit some unwanted energy. Various regulatory agencies, such as the Federal Communications Commission (FCC), impose limits on this emitted energy and any interference it may cause on other electronic devices. This emitted interference, or noise, generally appears as sharp spectral peaks, usually at the operating frequency of the device generating the noise, and a few harmonics of this operating frequency. A system designer may use a spread-spectrum PLL to reduce interference with high-Q receivers by spreading the energy over a larger portion of the frequency spectrum of the PLL output. For example, by changing the operating frequency up and down by a small amount, a device running at hundreds of megahertz can spread its interference evenly over a few megahertz of spectrum. This drastically reduces the amount of noise seen by other electronic devices.

BRIEF SUMMARY OF THE INVENTION

In one illustrative embodiment, a method, in a data processing system, is provided for compensating for process variations. The method may comprise selecting at least one resistor in a plurality of resistors in the circuit to provide a resistance value for generating a calibration voltage input to the circuit to compensate for variations in process. The method may further comprise comparing a reference signal to a feedback signal generated by the circuit based on the calibration signal. The method may also comprise determining if the feedback signal is within a tolerance of the reference signal and storing an identifier of the selected at least one resistor in a memory device coupled to the circuit if the feedback signal is within the tolerance of the reference signal. The circuit may be operated using the selected at least one resistor based on the identifier stored in the memory device.

In other illustrative embodiments, an apparatus is provided that comprises a multiplexer providing an output to a controlled circuit, a plurality of resistors coupled to the multiplexer and to a voltage source, the plurality of resistors providing a plurality of voltage inputs to the multiplexer, and a calibration circuit coupled to the multiplexer. During a calibration operation of the apparatus, the calibration circuit asserts a control signal to the multiplexer to select a voltage input from a selected resistor in the plurality of resistors for providing an output voltage of the multiplexer. During the calibration operation, the calibration circuit asserts different control signals to iterate through resistors in the plurality of resistors until a calibration condition is met. The calibration circuit stores an identifier of a resistor input to the multiplexer in response to the calibration condition being met. The calibration circuit asserts a control signal to the multiplexer corresponding to the stored identifier of the resistor input to the multiplexer during normal operation of the apparatus.

In yet another illustrative embodiment, an integrated circuit device is provided that comprises a phase locked loop circuit and a clock distribution circuit. The clock distribution circuit distributes a clock signal generated by the phase locked loop circuit to elements of a computing device. The phase locked loop circuit may comprise a multiplexer providing an output to a controlled circuit element of the phase locked loop, a plurality of resistors coupled to the multiplexer and to a voltage source, the plurality of resistors providing a plurality of voltage inputs to the multiplexer, and a calibration circuit coupled to the multiplexer. During a calibration operation of the phase locked loop circuit, the calibration circuit asserts a control signal to the multiplexer to select a voltage input from a selected resistor in the plurality of resistors for providing an output voltage of the multiplexer. During the calibration operation, the calibration circuit asserts different control signals to iterate through resistors in the plurality of resistors until a calibration condition is met. The calibration circuit stores an identifier of a resistor input to the multiplexer in response to the calibration condition being met. The calibration circuit asserts a control signal to the multiplexer corresponding to the stored identifier of the resistor input to the multiplexer during normal operation of the apparatus.

These and other features and advantages of the present invention will be described in, or will become apparent to those of ordinary skill in the art in view of, the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

The performance of phase locked loops (PLLs) is subject to variations in process parameters, power supply voltage, and temperature (PVT). It is common to reduce power supply sensitivity by using on-chip voltage regulators. However, there are no adequate mechanisms for compensating for process variation and temperature variation. Since a typical Complementary Metal-Oxide Semiconductor (CMOS) fabrication process (used to generate PLLs and circuits in which PLLs are utilized) may have approximately +/−30% to 40% delay variation, and temperature variation may be an additional 30% to 40%, it is very difficult to design a PLL that will operate with acceptable performance for critical applications, such as clock recover or clock generation, over wide temperature ranges with high yield in manufacturing.

The illustrative embodiments provide a PLL circuit that automatically compensates for temperature variation and may also be calibrated manually or automatically to compensate for process variation. To best understand the improvements made by the PLL circuit of the illustrative embodiments, it is first beneficial to understand the configuration of a conventional PLL circuit.

Figure 1:
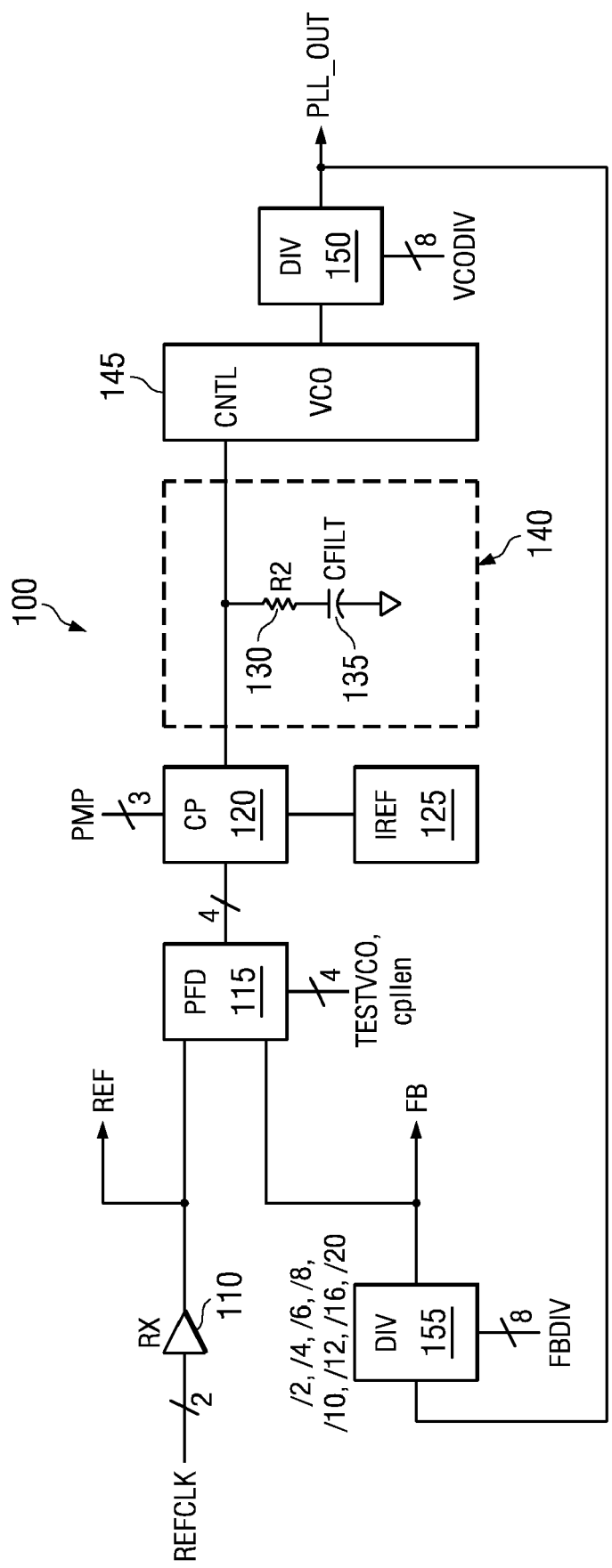
FIG. 1 is an exemplary block diagram of a known RC phase locked loop (PLL) circuit.

FIG. 1 is an exemplary block diagram of a conventional RC phase locked loop (PLL) circuit. As shown in FIG. 1, the conventional RC PLL circuit 100 includes a receiver (RX) 110 coupled to a phase frequency detector (PFD) 115 which is in turn coupled to a charge pump (CP) 120. A reference current signal from a reference current circuit (IREF) 125 is provided as an input to the charge pump 120 along with a control input, via a PMP bus for example, specifying the setting of the charge pump 120. The control input, which is set by a configuration register or is hard-wired into the circuit, sets the peak current for the charge pump 120. The charge pump is coupled to a resistor (R2) 130 and capacitor (CFILT) 135 which together constitute a resistance/capacitance (RC) filter 140 (also sometimes referred to as a "loop filter"). The RC filter 140 is coupled to a voltage controlled oscillator (VCO) 145 which in turn is coupled to a first divider 150. A feedback path is provided back to the input of the PFD 115 via a second divider 155.

The conventional RC PLL circuit 100 operates in a manner generally known in the art. That is, assuming the RC PLL circuit 100 is used for generating a core clock signal for a processor or other integrated circuit device, a reference clock signal is provided to the RC PLL circuit 100 via receiver 110. Preferably, the input to the receiver 110 is coupled to an external reference clock while the output of the first divider 150 is coupled to a clock input of a processor or other integrated circuit device. This reference clock signal is input to the phase frequency detector 115 which also receives as an input a feedback clock signal from the second divider 155, which divides the feedback signal from the first divider 150 by a programmable amount. The phase frequency detector 115 compares the feedback clock signal from the second divider 155 and detects a difference in phase and frequency between the reference clock signal and the feedback clock signal. The phase frequency detector 115 then generates an "up" or "down" control signal based on whether the feedback clock signal frequency is lagging or leading the reference clock signal frequency. These "up" or "down" control signals determine whether the VCO 145 needs to operate at a higher or lower frequency, respectively.

The PFD 115 outputs these "up" and "down" signals to the charge pump 120. If the charge pump 120 receives an "up" control signal, current is driven into the RC filter 140. Conversely, if the charge pump 120 receives a "down" control signal, current is drawn from the RC filter 140. The RC filter 140 converts these control signals into a control voltage that is used to bias the VCO 145. Based on the control voltage, the VCO 145 oscillates at a higher or lower frequency, which affects the phase and frequency of the feedback clock signal. If the PFD 115 produces an "up" control signal, then the VCO 145 frequency is increased. If the PFD 115 produces a "down" control signal, then the VCO 145 frequency is decreased. The VCO stabilizes once the reference clock signal and the feedback clock signal have the same phase and frequency. When the reference clock signal and the feedback clock signal are aligned, the RC PLL circuit 100 is considered locked.

The RC filter 140 operates to filter out jitter from the charge pump 120 output and to prevent voltage overshoot. Thus, the operation of the RC filter 140 affects the damping factor of the RC PLL circuit 100. The first and second dividers 150 and 155 operate to increase the VCO 145 frequency above the reference frequency of the reference clock signal. That is, the VCO 145 frequency is equal to a multiple of the reference clock signal frequency which may then be reduced by the divider circuits 150 and 155.

The PLL shown in FIG. 1 and described at length above is a conventional analog circuit PLL. The design of RC PLLs is relatively straight forward and relatively less complex than other alternatives. However, implementing high quality/precision resistors in Complementary Metal-Oxide Semiconductor (CMOS) is an expensive process requiring additional process steps with the resulting resistors taking up a large chip area. Moreover, it is difficult to form resistors using CMOS technology because of variations in process. As a result, the conventional feed-forward PLL was developed to eliminate the need for the resistor in the RC filter 140.

Figure 2:
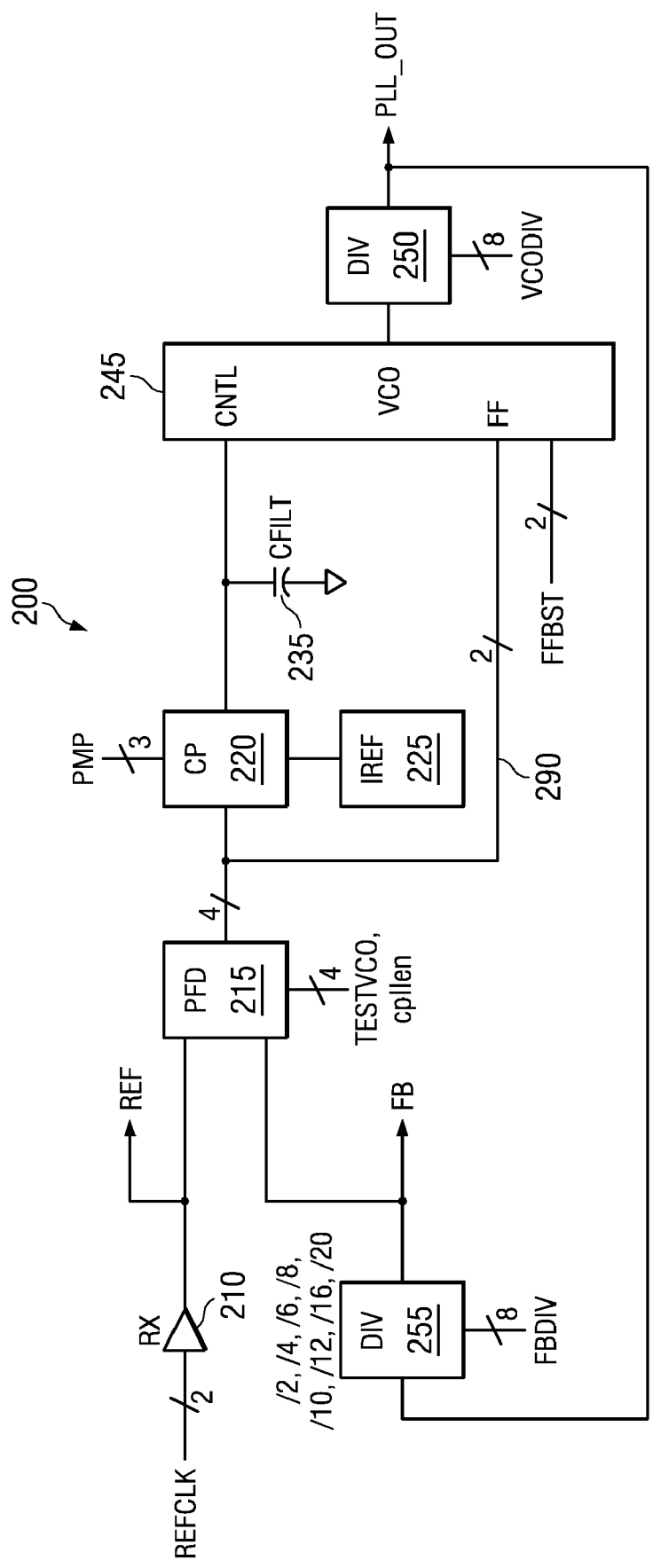
FIG. 2 is an exemplary block diagram of a conventional feed-forward PLL circuit.

FIG. 2 is an exemplary block diagram of a conventional feed-forward PLL circuit. The architecture of the conventional feed-forward PLL circuit 200 in FIG. 2 is similar to the architecture of the conventional RC PLL circuit 100 in FIG. 1 with two major exceptions. The first is that the resistor R2 in the RC filter 140 is removed from the conventional feed-forward PLL circuit 200. The second is that a feed-forward line 290 from the phase frequency detector 215 to the VCO 245 is provided. This feed-forward line 290 provides an equivalent resistance to the resistor R2 of the RC filter 140 in the conventional RC PLL circuit 100 in FIG. 1. The feed-forward line 290 allows the error signals from the PFD 215 to dither the frequency of the VCO 245. This modulation is similar to that introduced by the resistor and capacitor current of the RC filter 140.

Figure 3:
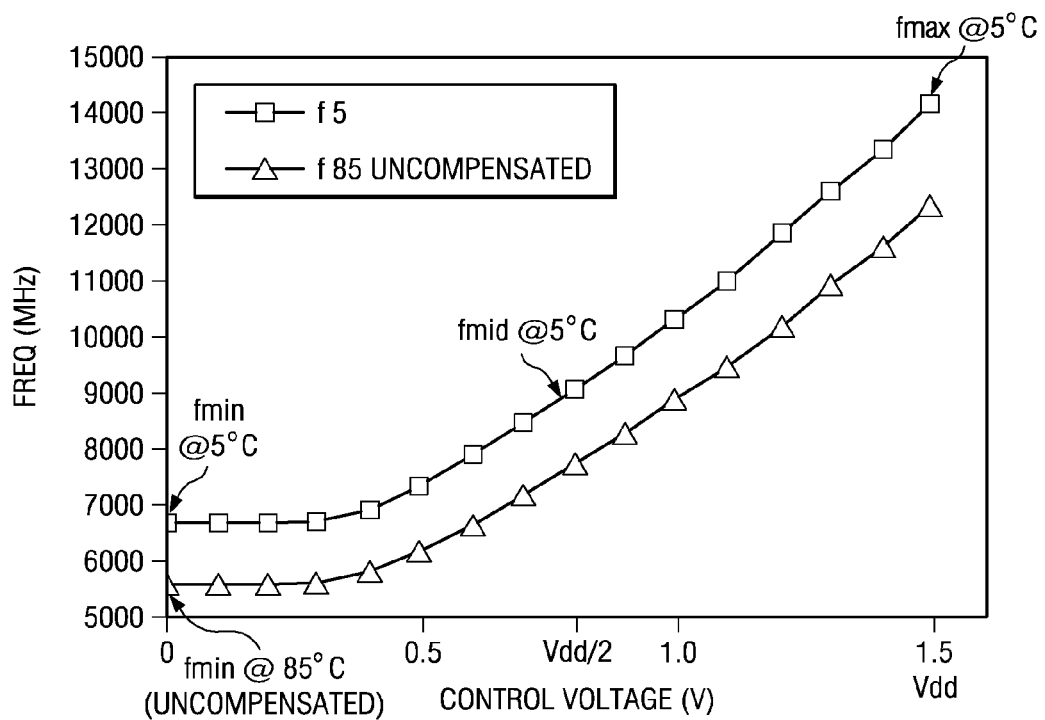
FIG. 3 is a plot of frequency versus control voltage for an uncompensated voltage controlled oscillator (VCO)

Conventional PLLs such as that shown in FIGS. 1 and 2 may use a conventional uncompensated VCO 145, 245, i.e. uncompensated with regard to temperature and process. Such an uncompensated VCO may have temperature characteristics such as shown in FIG. 3 which illustrates a plot of frequency versus control voltage for an uncompensated VCO. It should be noted from the plot in FIG. 3 that, for example, for an operating frequency of 6 GHz (6000 MHz), the uncompensated VCO is not useable at 5 degrees Celsius (the f5 curve shown in FIG. 3). That is, even at a control voltage of 0, the f5 curve shows that if the temperature is 5 degrees Celsius, the frequency of operation is approximately 6.9 GHz. Moreover, it can be seen from the plot of FIG. 3 that at 85 degrees Celsius (the f85 curve in FIG. 3), the uncompensated VCO is useable with a 6 GHz operating frequency by setting the control voltage to approximately 0.48V. Thus, as discussed above, this is a clear example of how temperature may affect the operation of a PLL, more specifically the VCO of a PLL.

Figure 4:
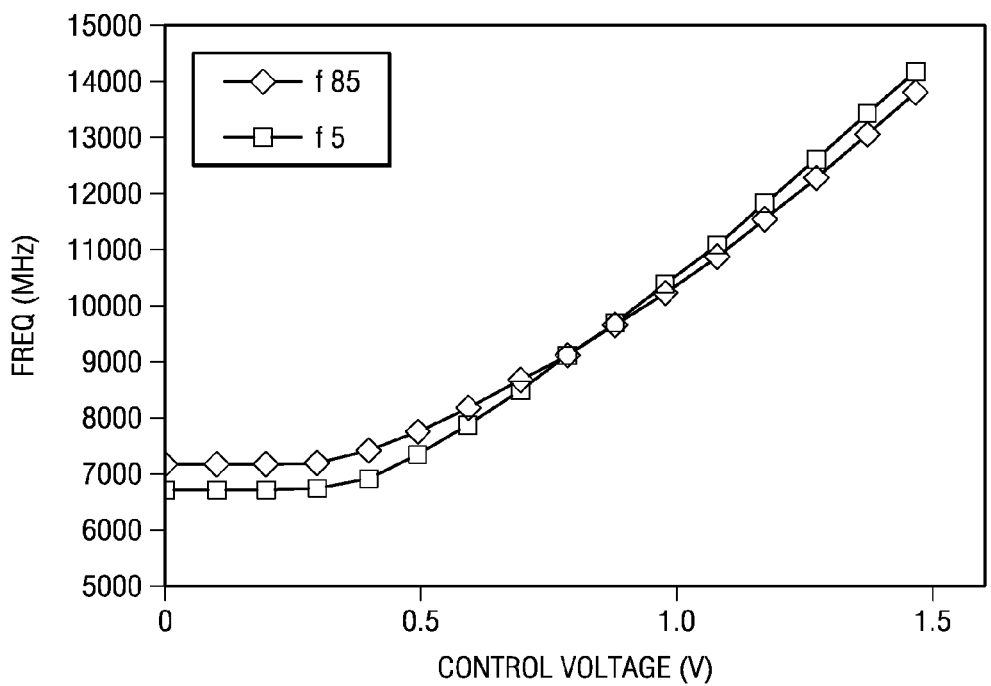
FIG. 4 is an exemplary block diagram of a temperature and process compensated PLL circuit in accordance with one illustrative embodiment.

Mechanisms, such as described in commonly assigned and co-pending U.S. Patent Application Publication No. 2008/0018408 may be provided for compensating for this sensitivity to temperature. Such a mechanism may achieve a lower sensitivity to temperature such as shown in FIG. 4. FIG. 4 is a plot of frequency versus control voltage for a temperature compensated VCO. As shown in FIG. 4, by implementing temperature compensation circuitry in the PLL, the two curves may, without process variations, substantially overlap thereby indicating a low sensitivity to temperature variations. That is, regardless of whether the temperature is 5 degrees Celsius or 85 degrees Celsius, approximately the same operational frequency is achieved for each possible control voltage input to the VCO of the PLL. However, because process variations are still present, in actual practice there is still a substantial gap between curves causing a continued sensitivity to temperature introduced by way of variations in process used to fabricate the PLL.

While a mechanism such as described in co-pending U.S. Patent Application Publication No. 2008/0018408 may be used to compensate for sensitivity to temperature variations in the VCO of the PLL, there are no adequate mechanisms for compensating for both temperature and process variations. Thus, even if the temperature sensitivity is compensated for by implementing a mechanism such as described in co-pending U.S. Patent Application Publication No. 2008/0018408, the VCO and thus, the PLL may still exhibit variations in operation due to the variations in process used to fabricate the PLL, e.g., random and/or systematic variations in the lithograph process and dopant. As mentioned above, these variations, which may be different from day to day, month to month, or the like, may be on the order of approximately +/−30% to 40% delay variation, which is significant. The illustrative embodiments provide a PLL circuit that includes circuitry for compensating for both temperature and process, thereby minimizing the sensitivity of the PLL circuit to variations in temperature and process with regard to its operational range.

Figure 5:
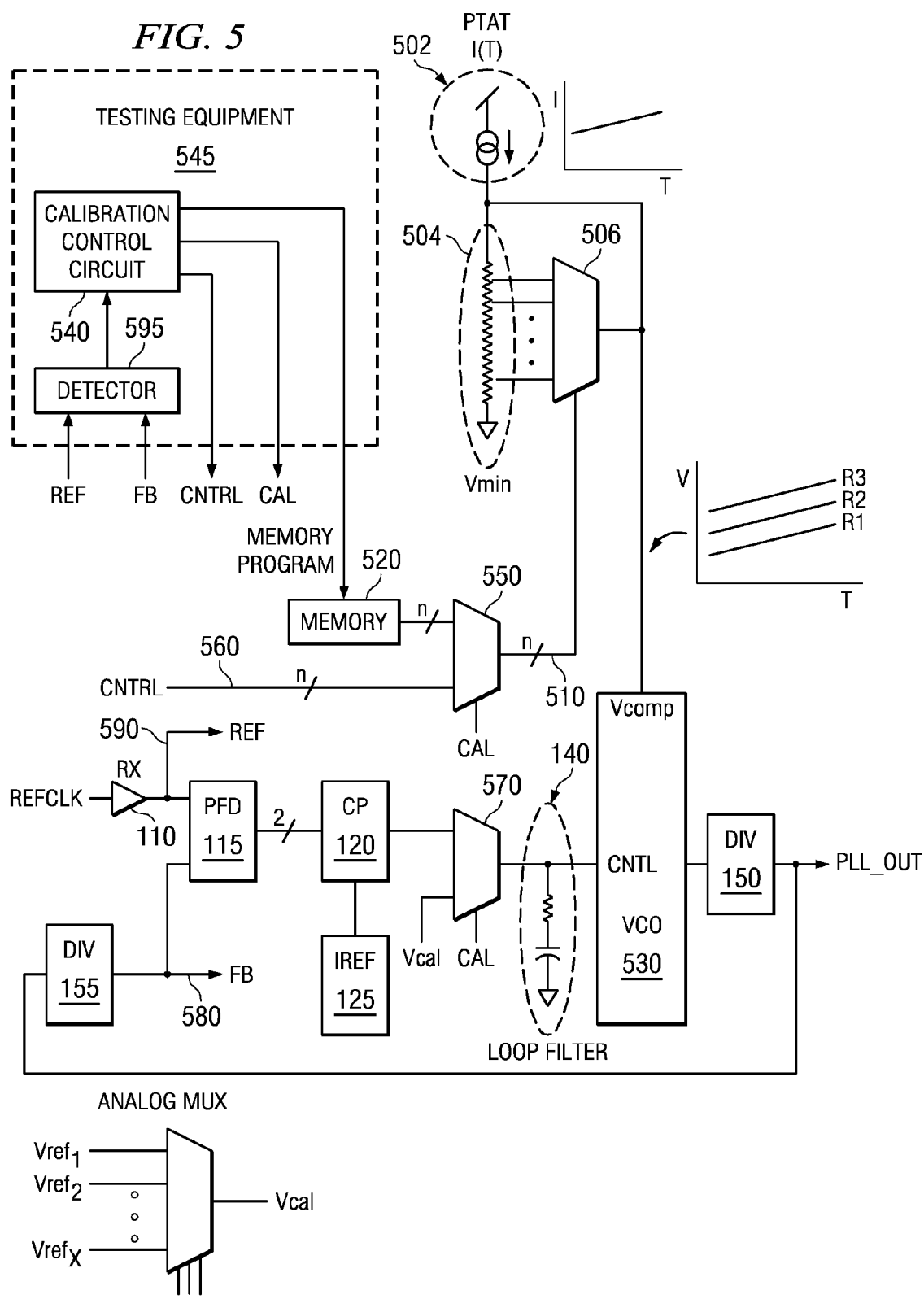
FIG. 5 is a plot of voltage versus temperature that illustrates a compensation voltage adjustment process performed using the temperature and process compensated PLL circuit of one illustrative embodiment.

FIG. 5 is an exemplary block diagram of a temperature and process compensated PLL circuit 500 in accordance with one illustrative embodiment. Elements in the PLL circuit 500 that operate in a substantially similar manner to that of the conventional PLL circuit shown in FIG. 1 or 2 are depicted with similar reference numbers. For ease of explanation, reference is made only to those similar elements in FIG. 1, although it should be appreciated that the mechanisms of the illustrative embodiments may also be applied to the PLL circuit configuration shown in FIG. 2 without departing from the spirit and scope of the present invention.

As shown in FIG. 5, a current source 502 with a current that is proportional to absolute temperature (PTAT) is used to bias a programmable resistor string 504, comprising a plurality of resistors, to generate a voltage which is also a PTAT source. The resistance is adjustable through a multiplexer 506 which has its tap, i.e. the input that is selected for output by the multiplexer 506, selected through an n-bit control bus 510. During normal operation, the control bus 510 is static with a value that is stored in a memory 520. This memory 520 may be a flash memory, a bank of efuses, or other memory device. The value that is stored in the memory 520 may be established during a calibration procedure which can be performed during manufacturing testing, engineering bring-up, during a power-on reset (POR) sequence, or periodically during operation if desired.

The PTAT source 502 is designed so that a change in compensation voltage ($V_{comp}$), i.e. $\{V_{comp}(T_{max})-V_{comp}(T_{min})\}=\{V_{max}-V_{min}\}$ over the full operating temperature range $\{T_{max}-T_{min}\}$ at the $V_{comp}$ input to the voltage controlled oscillator (VCO) 530 will adequately compensate the VCO 530 over temperature for a given process condition. During functional mode, the PLL operates with a fixed resistance determined by the value stored in the memory 520. As temperature changes, the voltage at the $V_{comp}$ input will vary to achieve a VCO operational characteristic similar to that shown in FIG. 4 assuming no variation in process used to fabricate the PLL circuit 500. The manner by which $V_{comp}$ may modify the operational characteristics of a VCO is described, for example, in co-pending U.S. Patent Application Publication No. 2008/0018408.

However, it should be noted that as process varies, the optimum resistance value, for generating the $V_{comp}$ input to the VCO 530, for a given temperature may change. That is, keeping the selected resistance value R of the resistor string 504 the same, for a given temperature, a different $V_{comp}$ value will be input to the VCO 530 if there is a variation in process. As a result, a different operational frequency will be achieved than desired. In other words, for a given resistance value R and a given temperature T, the control voltage versus frequency curve in FIG. 4 is shifted from that depicted.

In order to adjust for process variations, a calibration process is utilized with the mechanisms of the illustrative embodiments. During the calibration process, a calibration signal CAL is asserted by a calibration control circuit 540 which may be integrated into the integrated circuit device in which the PLL circuit 500 is provided or may be external to the integrate circuit device and PLL circuit 500, such as provided in external testing equipment 545, for example. The calibration signal CAL is input to a multiplexer 550 with inputs from memory 520 and a control bus CNTRL 560. During normal operation, with the CAL signal not asserted, the multiplexer 550 selects the input from memory 520 for output by the multiplexer 550 to multiplexer 506. During a calibration process, when the CAL signal is asserted, the CAL signal selects the n-bit CNTRL bus 560 input through the multiplexer 550 as well as a DC calibration voltage $V_{cal}$ via multiplexer 570. This calibration voltage $V_{cal}$ is applied directly to the PLL loop filter 140 through the multiplexer 570. The value of $V_{cal}$ corresponds to the voltage required at the VCO 530 input to bias the VCO 530 at a predetermined frequency, such as $f_{min}$, $f_{mid}$, $f_{max}$, or some other frequency of interest. That is, $V_{cal}$ will usually be zero volts, Vdd/2, or Vdd, corresponding to $f_{min}$, $f_{mid}$, or $f_{max}$ of the VCO 530, respectively. $V_{cal}$ is provided by a reference voltage and is constant for a given calibration step. However, there may be multiple calibrations steps to ensure accuracy.

At the feedback (FB) output pin 580, the VCO 530 frequency is divided down to a frequency which is compared to the frequency of the reference clock input (REF) pin 590. This comparison may be done with integrated or external frequency or phase-frequency detector 595, an oscilloscope, or other test equipment either internal or external to the circuitry of the PLL 500 or the integrated circuit device in which the PLL 500 is implemented. Based on the results of the comparison, a different CNTRL input is provided via the CNTRL bus 560 until the FB output pin 580 has a value matching that of the REF pin 590 within a given tolerance. That is, the CNTRL input is stepped through each of the possible selected inputs of multiplexer 506, starting with $V_{min}$ or $V_{max}$, from the resistor string 504 until matching outputs of pins 580 and 590 within a given tolerance are achieved. This calibration is performed at a temperature $T_{cal}$. The CNTRL value that results in matching (within a given tolerance) outputs of pins 580 and 590 may then be stored in the memory 520 and the calibration signal CAL may be de-asserted.

That is, the detector 595 may send a signal to the calibration control circuit 540 informing the calibration control circuit 540 of whether the detector 595 has detected that the outputs of pins 580 and 590 match or do not match within the given tolerance. If the detector 595 indicates that there is not a match, then the calibration control circuit 540 may increment the control signal CNTRL on the control bus 560 to select a next input to the multiplexer 506 for output to the $V_{comp}$ input of the VCO 530. If the detector 595 indicates that there is a match, the calibration control circuit 540 may send a signal to the memory 520 to store the value of CNTRL that resulted in the matching outputs at pins 580 and 590. In addition, the calibration control circuit 540 may de-assert the calibration signal CAL thereby discontinuing the calibration process. The value stored in the memory 520 may thereafter be used during functional mode of operation of the PLL 500 until a next calibration process is determined to be necessary. As mentioned above, this calibration operation may be performed during manufacturing testing, engineering bring-up, during a power-on reset (POR) sequence, periodically during functional operation of the PLL, or the like.

Thus, the illustrative embodiments provide a mechanism by which process variations, which will cause the necessary resistance for generating a desired temperature compensated VCO operation to change, may themselves be compensated for by performing a calibration process. Thus, the mechanisms of the illustrative embodiments not only compensate for temperature variations, but also process variations. Moreover, as mentioned above, it is known to use on-chip voltage regulators to reduce power supply sensitivity. Such on-chip voltage regulators may be used in conjunction with the circuitry of FIG. 5 in order to achieve a PLL circuit configuration that is not sensitive to any of process, voltage, or temperature (PVT).

Figure 6:
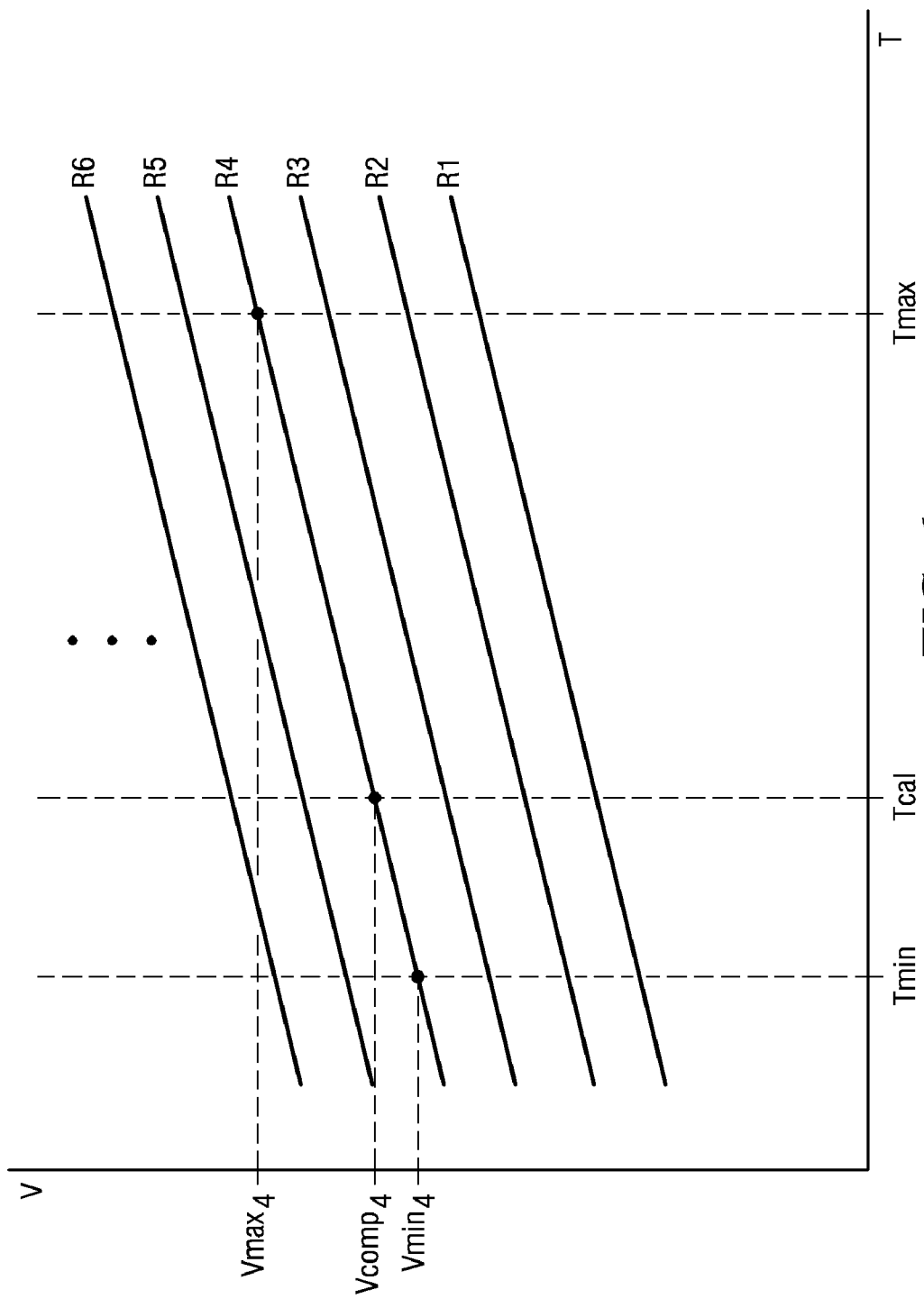
FIG. 6 is a plot of frequency versus control voltage for a compensated VCO in accordance with one illustrative embodiment.

FIG. 6 is a plot of voltage versus temperature that illustrates a compensation voltage adjustment process performed using the temperature and process compensated PLL circuit of one illustrative embodiment. As shown in FIG. 6, a calibration temperature $T_{cal}$ is determined for use in calibrating the PLL 500 of FIG. 5. This calibration temperature $T_{cal}$ may be a predefined temperature, e.g., 25 degrees Celsius, or whatever the current temperature of the PLL 500 circuitry is at the time that the calibration process is started. The main concern is that $T_{cal}$ should be kept constant during the calibration process and should be somewhere between maximum and minimum operational temperatures $T_{max}$ and $T_{min}$.

As mentioned above, the CNTRL bus is initially set to select the multiplexer 506 input corresponding to $V_{min}$ in the resistor string 504, i.e. resistor R1 in the plot of FIG. 6. The DC calibration voltage $V_{cal}$ is applied to the PLL loop filter 570. The CNTRL bus is then stepped through the different resistance values R1 through R6 until the frequencies at the REF pin 590 and the FB pin 580 match within a tolerance. That is, with reference again to FIG. 4, it is desired to have an operational frequency of, for example, 7 GHz (7000 MHz). The temperature is fixed to a calibration temperature $T_{cal}$ which effectively selects a curve within the plot of FIG. 4, e.g., $T_{cal}$ may be 5 degrees Celsius thereby selecting the f5 curve in FIG. 4. The resistance values are stepped through in order to provide a different control voltage within the plot of FIG. 4 until the desired operating frequency is achieved within a given tolerance. The resulting R value, e.g., R4 in the depicted example, is then selected for functional operation of the PLL circuit 500. The CNTRL value used to select the R value, e.g., R4, is then stored in memory 520. As a result, a desired compensation voltage $V_{comp}$ is selected and used in the PLL circuit.

As shown in FIG. 6, each resistance value R corresponds to a different process adjustment. For example, R6 provides a large $V_{comp}$ which would effectively offset the effects of a slow process. The $V_{comp}$ value will increase with temperature for a given resistor to offset the effect of the VCO frequency which normally decreases with temperature.

Figure 7:
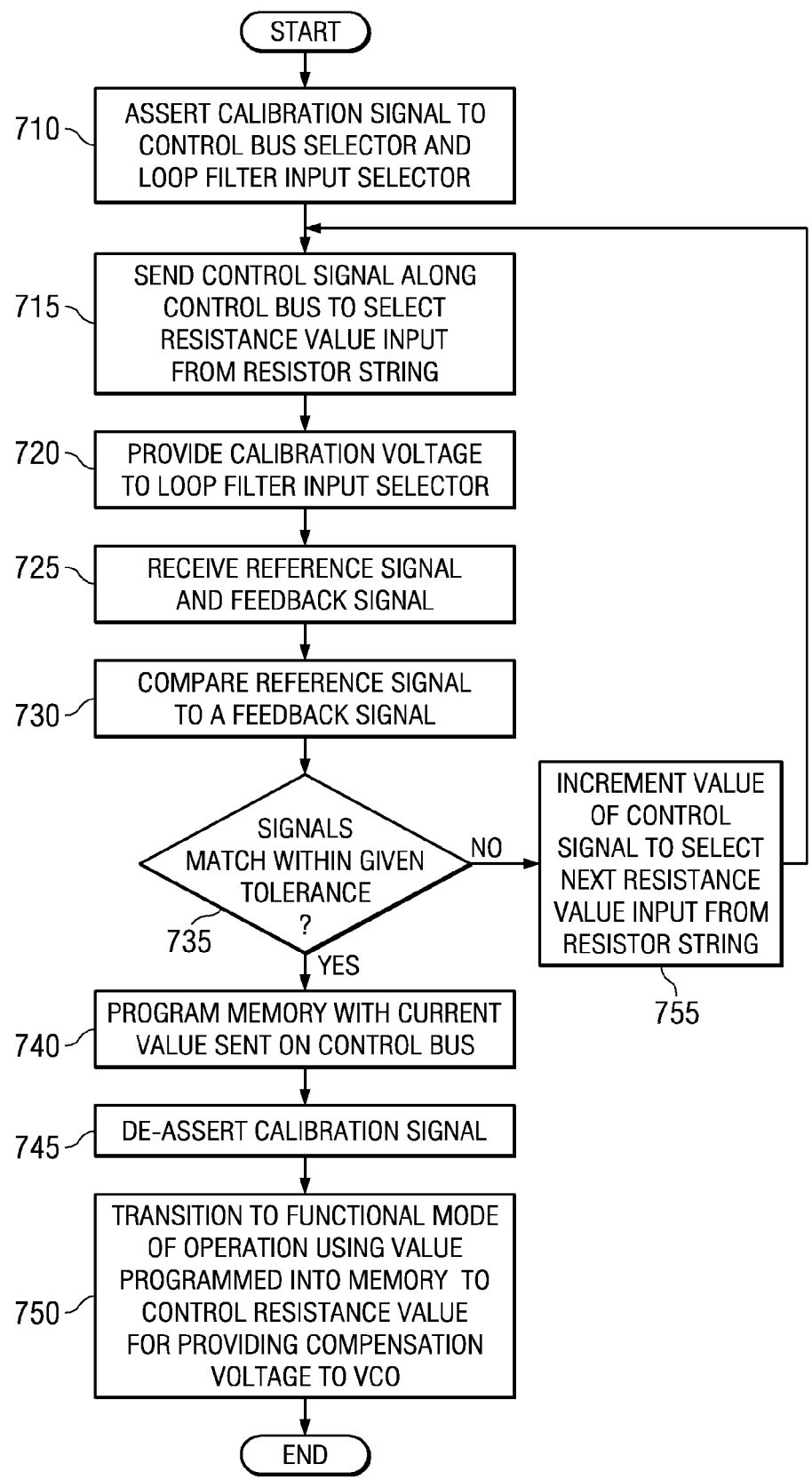
FIG. 7 is a flowchart outlining a control voltage adjustment operation of a temperature and process compensated PLL circuit in accordance with one illustrative embodiment.

FIG. 7 is a flowchart outlining a control voltage adjustment operation of a temperature and process compensated PLL circuit in accordance with one illustrative embodiment. The operation outlined in FIG. 7 may be implemented, for example, in a calibration control circuit of testing equipment, for example, such as calibration control circuit 540 in FIG. 5. As mentioned above, this testing equipment and/or calibration control circuit may be integrated into the same integrated circuit device as the PLL circuit is provided or may be external to the PLL circuit and/or the integrated circuit device in which the PLL circuit is provided. Moreover, the operation outlined in FIG. 7 may be implemented in hardware, software, or any combination of hardware and software.

Thus, it will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

Furthermore, the flowchart is provided to demonstrate the operations performed within the illustrative embodiments. The flowchart is not meant to state or imply limitations with regard to the specific operations or, more particularly, the order of the operations. The operations of the flowchart may be modified to suit a particular implementation without departing from the spirit and scope of the present invention.

As shown in FIG. 7, the operation starts, in response to a determination that a calibration operation is necessary for the PLL circuit, by the calibration control circuit asserting a calibration signal to a control bus selector, e.g., multiplexer 550 in FIG. 5, and a loop filter input selector, e.g., multiplexer 570 in FIG. 5 (step 710). The calibration control circuit sends a control signal along the control bus, the control signal having a value that selects a starting resistance value input from the resistor string, e.g., resistor string 504 in FIG. 5 (step 715). A calibration voltage is provided to the loop filter input selector (step 720).

A reference signal and feedback signal are received from the PLL circuit (step 725). The reference signal and feedback signal are compared by a detector associated with the calibration control circuit (step 730). The calibration control circuit determines if the reference signal and feedback signal match within a given tolerance (step 735). If so, the calibration control circuit programs the memory associated with the PLL circuit with a current value of the control signal sent along the control bus (step 740). This in effect programs the memory with the value for selecting the proper resistance value for modifying the compensation voltage to the voltage controlled oscillator (VCO) of the PLL.

Thereafter, the calibration signal is de-asserted (step 745) and the PLL circuit is transitioned to a functional mode of operation (step 750). In this functional mode of operation, the PLL circuit uses the value stored in the memory to control the resistance value used to modify the compensation voltage to the VCO. The operation then ends. However, it should be noted that this process may be repeated at a later time if a re-calibration of the PLL circuit is determined to be necessary or desirable.

If the reference signal and the feedback signal do not match within the given tolerance (step 735), then the value of the control signal is incremented (or decremented depending upon the implementation), so as to select the next resistance value input from the resistor string (step 755). The operation then returns to step 715.

Thus, the illustrative embodiments provide mechanisms for compensating for both temperature and process variations within a PLL circuit. The mechanisms of the illustrative embodiments permit calibration of the PLL circuit, and re-calibration of the PLL circuit if necessary. As a result, a PLL circuit is achieved that is virtually insensitive to variations in temperature and process. Combining this PLL circuit with on-chip voltage regulators provides a PLL circuit that is also insensitive to variations is voltage as well.

Figure 8:
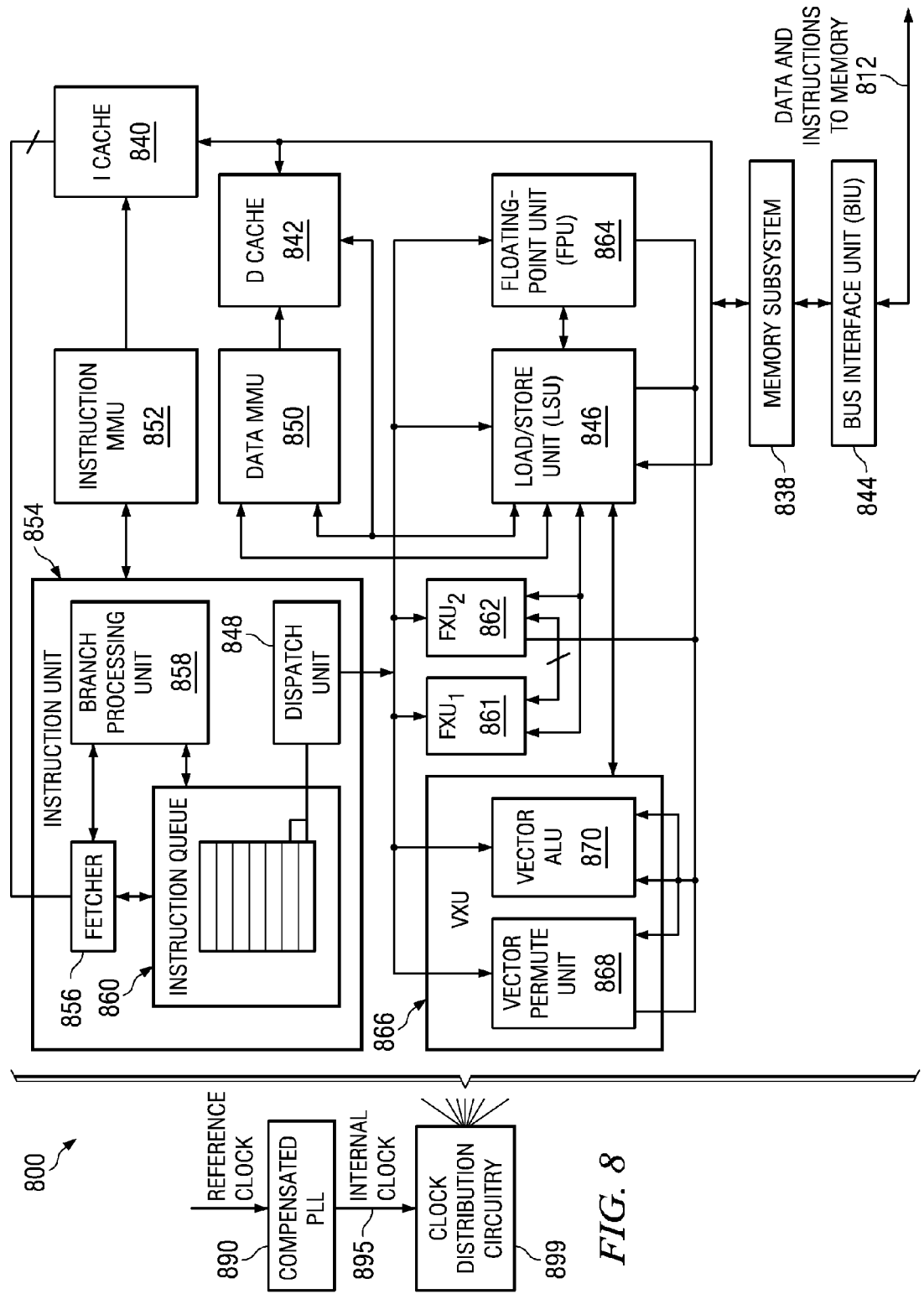
FIG. 8 is an exemplary diagram of a processor in which the temperature and process compensated PLL of the illustrative embodiments may be implemented.

The temperature and process compensated PLL of the illustrative embodiments may be implemented in a number of different types of circuit devices. One particular implementation of the temperature and process compensated PLL of the illustrative embodiments is in the generation of internal clock signals for processors of data processing devices. FIG. 8 is an exemplary diagram of a processor in which the temperature and process compensated PLL of the illustrative embodiments may be implemented. The depiction of the processor in FIG. 8 is provided as a high-level functional block diagram of selected operational blocks that may be included in a central processing unit (CPU) 800.

In one illustrated embodiment, CPU 800 includes internal instruction cache (I-cache) 840 and data cache (D-cache) 842 which are accessible to memory (not shown in FIG. 8) through bus 812, bus interface unit 844, memory subsystem 838, load/store unit (LSU) 846 and corresponding memory management units: data MMU 850 and instruction MMU 852. In the depicted architecture, CPU 800 operates on data in response to instructions retrieved from I-cache 840 through instruction dispatch unit 848. Dispatch unit 848 may be included in instruction unit 854 which may also incorporate fetcher 856 and branch processing unit 858 that controls instruction branching.

An instruction queue 860 may interface fetcher 856 and dispatch unit 848. In response to dispatched instructions, data retrieved from D-cache 842 by load/store unit 846 can be operated upon by one of fixed point unit (FXU) 861, FXU 862 or floating point execution unit (FPU) 864. Additionally, CPU 800 provides for parallel processing of multiple data items via vector execution unit (VXU) 866. VXU 866 may include a vector permute unit 868 that performs permutation operations on vector operands, and a vector arithmetic logic unit (VALU) 870 that performs vector arithmetic operations such as fixed-point and floating-point operations on vector operands.

Each unit, such as instruction unit 854, VXU 866, FXUs 861 and 862, LSU 846, and FPU 864, along the instruction pipelines, are enabled and synchronized by an internal clock signal 895. Such an internal clock signal 895 may be generated using an output of the temperature and process compensated PLL 890 of the illustrative embodiments and may be distributed to the various units via clock distribution circuitry 899. While the temperature and process compensated PLL 890 of the illustrative embodiments may be used to provide a clock signal for enabling and synchronizing the units of the processor 800, the temperature and process compensated PLL of the illustrative embodiments may be used to provide other types of signals as well depending upon the particular use to which the temperature and process compensated PLL is put.

The temperature and process compensated PLL circuit as described above may be part of the design for an integrated circuit chip, such as a chip in which the processor 800 of FIG. 8 may be provided, or the like. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a circuit, for compensating for process variations, comprising:

asserting a calibration signal to the circuit;

selecting at least one resistor in a plurality of resistors in the circuit to provide a resistance value for generating a calibration voltage input to the circuit to compensate for variations in process based on one of an output from a memory device storing an identifier of a resistor previously selected from the plurality of resistors in the plurality of resistors or a control input to an n-bit bus of the circuit from testing equipment indicating the at least one resistor in the plurality of resistors to select;

applying a second calibration voltage directly to a loop filter of the circuit via a multiplexer coupled to the loop filter, wherein the second calibration voltage is selected by the multiplexer, from a plurality of possible second calibration voltages provided as input to the multiplexer, to thereby bias a voltage controlled oscillator of the circuit at a predetermined frequency of interest;

comparing a first frequency of a reference signal to a second frequency of a feedback signal generated by the circuit based on the calibration voltage;

determining if the second frequency of the feedback signal is within a tolerance of the first frequency of the reference signal;

storing an identifier of the selected at least one resistor in the memory device coupled to the circuit if the second frequency of the feedback signal is within the tolerance of the first frequency of the reference signal;

de-asserting the calibration signal after storing the identifier of the selected at least one resistor in the memory device, wherein the selecting, comparing, and determining operations are performed in response to asserting the calibration signal;

providing a control input to an n-bit bus of the circuit in response to the second frequency of the feedback signal not being within the tolerance of the first frequency of the reference signal;

selecting one of the control input to the n-bit bus or an output from the memory device in response to the calibration signal being asserted or de-asserted, wherein the control input is selected in response to the calibration signal being asserted, and wherein the output from the memory device is selected in response to the calibration signal being de-asserted; and operating the circuit using the selected at least one resistor based on the identifier stored in the memory device whereby a voltage output of the at least one resistor is input as a compensation voltage to the voltage controlled oscillator of the circuit.

2. The method of claim 1, wherein the operations of selecting at least one resistor, comparing, and determining are performed iteratively for resistors in the plurality of resistors until the feedback signal is determined to be within the tolerance of the reference signal.

3. The method of claim 1, wherein the resistance value of the selected at least one resistor is applied to a voltage signal for compensating for temperature of the circuit.

4. The method of claim 1, wherein the circuit is a phase locked loop circuit.

5. An apparatus, comprising:

a first multiplexer providing an output to a controlled circuit;

a plurality of resistors coupled to the first multiplexer and to a voltage source, the plurality of resistors providing a plurality of voltage inputs to the first multiplexer;

a calibration circuit coupled to the first multiplexer; and a calibration voltage generation circuit coupled to the controlled circuit, wherein:

calibration control circuitry of the calibration circuit asserts a calibration signal to initiate a calibration operation;

during a calibration operation of the apparatus, the calibration circuit asserts a control signal to the first multiplexer to select a voltage input from a selected resistor in the plurality of resistors for providing an output voltage of the first multiplexer;

the selected resistor, in the plurality of resistors, is selected based on one of an output from a memory device of the calibration circuit storing an identifier of a resistor previously selected from the plurality of resistors in the plurality of resistors or a control input from the calibration circuit to an n-bit bus of the calibration circuit indicating the selected resistor in the plurality of resistors to select;

the calibration voltage generation circuit applies a second calibration voltage directly to a loop filter of the controlled circuit via a second multiplexer coupled to the loop filter, the second calibration voltage is selected by the second multiplexer, from a plurality of possible second calibration voltages provided as input to the second multiplexer, to thereby bias a voltage controlled oscillator of the controlled circuit at a predetermined frequency of interest;

during the calibration operation, the calibration circuit asserts different control signals to iterate through resistors in the plurality of resistors until a calibration condition is met;

during the calibration operation, the calibration circuit compares a first frequency of a reference signal to a second frequency of a feedback signal generated by the controlled circuit based on the calibration voltage;

during the calibration operation, the calibration circuit determines if the second frequency is within a tolerance of the first frequency;

the calibration circuit stores an identifier of the selected resistor in response to the second frequency being within the tolerance of the first frequency;

during the calibration operation, the calibration circuit de-asserts the calibration signal after storing the identifier of the selected resistor in the memory device, the different control signals are asserted by the calibration circuit in response to the second frequency of the feedback signal not being within the tolerance of the first frequency of the reference signal;

the calibration circuit selects to assert one of the different control signals to the first multiplexer in response to the calibration signal being asserted during the calibration operation; and the calibration circuit asserts a control signal to the first multiplexer corresponding to the stored identifier of the resistor during normal operation of the apparatus.

6. The apparatus of claim 5, wherein the voltage source generates a voltage that is proportional to ambient temperature.

7. The apparatus of claim 5, wherein an operation of the voltage controlled oscillator is modified based on the output from the first multiplexer in order to compensate for both variations in temperature and variations in process.

8. The apparatus of claim 7, wherein the voltage controlled oscillator is part of a phase locked loop circuit.

9. An integrated circuit device, comprising:

a phase locked loop circuit; and a clock distribution circuit, wherein the clock distribution circuit distributes a clock signal generated by the phase locked loop circuit to elements of a computing device, and wherein the phase locked loop circuit comprises:

a first multiplexer providing an output to a controlled circuit element of the phase locked loop;

a plurality of resistors coupled to the first multiplexer and to a voltage source, the plurality of resistors providing a plurality of voltage inputs to the first multiplexer;

a calibration circuit coupled to the first multiplexer; and a calibration voltage generation circuit coupled to the controlled circuit, and wherein:

calibration control circuitry of the calibration circuit asserts a calibration signal to initiate a calibration operation;

during a calibration operation of the phase locked loop circuit, the calibration circuit asserts a control signal to the first multiplexer to select a voltage input from a selected resistor in the plurality of resistors for providing an output voltage of the first multiplexer;

the selected resistor, in the plurality of resistors, is selected based on one of an output from a memory device of the calibration circuit storing an identifier of a resistor previously selected from the plurality of resistors in the plurality of resistors or a control input from the calibration circuit to an n-bit bus of the calibration circuit indicating the selected resistor in the plurality of resistors to select;

the calibration voltage generation circuit applies a second calibration voltage directly to a loop filter of the controlled circuit via a second multiplexer coupled to the loop filter, the second calibration voltage is selected by the second multiplexer, from a plurality of possible second calibration voltages provided as input to the second multiplexer, to thereby bias a voltage controlled oscillator of the controlled circuit at a predetermined frequency of interest;

during the calibration operation, the calibration circuit asserts different control signals to iterate through resistors in the plurality of resistors until a calibration condition is met;

during the calibration operation, the calibration circuit compares a first frequency of a reference signal to a second frequency of a feedback signal generated by the controlled circuit based on the calibration voltage;

during the calibration operation, the calibration circuit determines if the second frequency is within a tolerance of the first frequency;

the calibration circuit stores an identifier of the selected resistor in response to the second frequency being within the tolerance of the first frequency;

during the calibration operation, the calibration circuit de-asserts the calibration signal after storing the identifier of the selected resistor in the memory device, the different control signals are asserted by the calibration circuit in response to the second frequency of the feedback signal not being within the tolerance of the first frequency of the reference signal;

the calibration circuit selects to assert one of the different control signals to the first multiplexer in response to the calibration signal being asserted during the calibration operation; and the calibration circuit asserts a control signal to the first multiplexer corresponding to the stored identifier of the resistor during normal operation of the apparatus.

10. The integrated circuit device of claim 9, wherein the voltage source generates a voltage that is proportional to ambient temperature.

11. The integrated circuit device of claim 9, wherein an operation of the voltage controlled oscillator is modified based on the output from the first multiplexer in order to compensate for both variations in temperature and variations in process.

* * * * *